(12) United States Patent
Yuan et al.

(10) Patent No.: US 7,308,671 B1
(45) Date of Patent: Dec. 11, 2007

(54) METHOD AND APPARATUS FOR PERFORMING MAPPING ONTO FIELD PROGRAMMABLE GATE ARRAYS UTILIZING FRACTURABLE LOGIC CELLS

(75) Inventors: Jinyong Yuan, Cupertino, CA (US); Sinan Kaptanoglu, Belmont, CA (US)

(73) Assignee: Altera Corporation, San Jose, CA (US)

( * ) Notice: Subject to any disclaimer, the term of this patent is extended or adjusted under 35 U.S.C. 154(b) by 242 days.

(21) Appl. No.: 11/005,969

(22) Filed: Dec. 6, 2004

(51) Int. Cl.
*G06F 17/50* (2006.01)

(52) U.S. Cl. .......................................... 716/16; 716/17

(58) Field of Classification Search ............ 716/16–18, 716/2
See application file for complete search history.

(56) References Cited

U.S. PATENT DOCUMENTS

| | | | | |
|---|---|---|---|---|
| 6,336,208 B1* | 1/2002 | Mohan et al. | ................. | 716/16 |
| 7,019,557 B2* | 3/2006 | Madurawe | ................... | 326/38 |
| 7,020,864 B1* | 3/2006 | Loong | ......................... | 716/16 |
| 2004/0133869 A1* | 7/2004 | Sharma | ....................... | 716/16 |
| 2005/0039157 A1* | 2/2005 | Sharma et al. | ................. | 716/18 |
| 2005/0040849 A1* | 2/2005 | Pugh et al. | .................... | 326/39 |

* cited by examiner

*Primary Examiner*—Jack Chiang
*Assistant Examiner*—Binh Tat
(74) *Attorney, Agent, or Firm*—L. Cho (57) ABSTRACT

A method for designing a system on a field programmable gate array (FPGA) includes performing mapping with a plurality of passes where a different assumption is made with respect to a property of the FPGA during each pass.

19 Claims, 6 Drawing Sheets

METHOD AND APPARATUS FOR PERFORMING MAPPING ONTO FIELD PROGRAMMABLE GATE ARRAYS UTILIZING FRACTURABLE LOGIC CELLS

FIELD

Embodiments of the present invention relate to mapping techniques for programming field programmable gate arrays (FPGAs). More specifically, embodiments of the present invention relate to a method and apparatus for performing mapping onto FPGAs utilizing fracturable logic cells.

BACKGROUND

FPGAs may be used to implement large systems that include millions of gates and megabits of embedded memory. Today, FPGAs may utilize fracturable logic cells. Fracturable logic cells include a variety of look-up table (LUT)-based resources that can be used to implement a single adaptive LUT having a first number of inputs or be divided between a plurality of adaptive LUTs having the same or a different number of inputs. Each fracturable logic cell may be used to implement more than one function. Compared to traditional logic cells that may only implement a single function, fracturable logic cells provide designers with more flexibility and more opportunities to maximize the utilization of resources on FPGAs.

The process flow for implementing a system onto a target FPGA device includes performing synthesis, mapping, placement, and routing. Synthesis involves generating a logic design of the system to be implemented by a target device and mapping the logic design onto resources on the FPGA that will implement the logic design. Traditional mapping techniques map components in the logic design onto LUTs assuming that each LUT supports a fixed number of inputs. Although sufficient for traditional FPGA devices, these mapping techniques are not well suited for FPGAs implementing fracturable logic cells having adaptive LUTs that support more than a single number of inputs. By assuming that the adaptive LUTs support only a single number of inputs, these mapping techniques may create inefficient solutions by either generating too many unpackable adaptive LUTs that would waste resources or fail to fully take advantage of the functionality of the adaptive LUTs to implement functions with a higher number of inputs.

Thus what is needed is an effective method and apparatus for performing mapping onto FPGAs utilizing fracturable logic cells.

SUMMARY

According to an embodiment of the present invention, mapping is performed using a plurality of passes where a different assumption is made with respect to a property of a FPGA, such as the inputs supported by adaptive LUTs, during each pass. During a first pass, components of a logic design are mapped onto adaptive look up table LUTs where the adaptive LUTs are assumed to support a first number of inputs. The mapping results that satisfy one or more conditions are preserved. During a second pass, components of the logic design having a mapping not satisfying the one or more conditions are mapped onto adaptive LUTs where the adaptive LUTs are assumed to support a second number of inputs. This approach utilizes the advantages of the adaptive LUT mapping for each configuration of the adaptive LUTs, generating a mapping that improves the density of the FPGA.

BRIEF DESCRIPTION OF THE DRAWINGS

The features and advantages of embodiments of the present invention are illustrated by way of example and are not intended to limit the scope of the embodiments of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that specific details in the description may not be required to practice the embodiments of the present invention. In other instances, well-known components, programs, and procedures are shown in block diagram form to avoid obscuring embodiments of the present invention unnecessarily.

Figure 1:
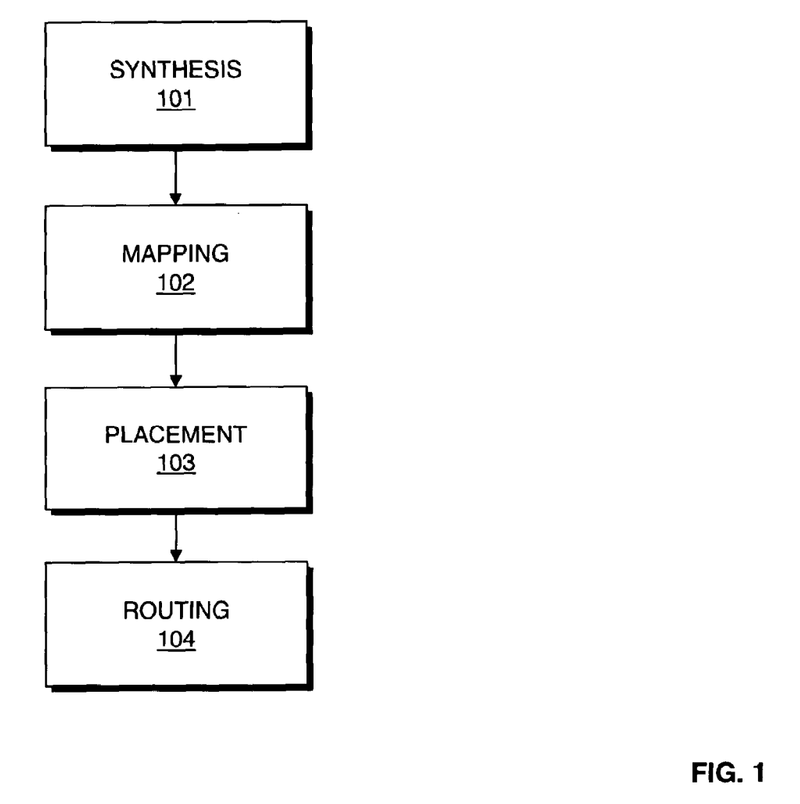
FIG. 1 is a flow chart illustrating a method for designing a system according to an embodiment of the present invention.

FIG. 1 is a flow chart that illustrates a method for designing a system according to an embodiment of the present invention. The method may be performed with the assistance of an EDA tool, for example. At 101, synthesis is performed. Synthesis includes generating a logic design of the system to be implemented by a target device. According to an embodiment of the present invention, synthesis generates an optimized logical representation of the system from a Hardware Description Language (HDL) design definition. The optimized logical representation of the system may include a representation that includes a minimized number of logic gates and logic elements required for the system. Alternatively, the optimized logical representation of the system may include a representation that has a reduced depth of logic and that generates a lower signal propagation delay.

At 102, the optimized logic design is mapped. Mapping includes determining how to implement the logic components such as logic gates in the optimized logical representation with general resources available on the target device. According to an embodiment of the present invention, the components of the logic design are mapped onto an FPGA that includes fracturable logic cells. In this embodiment, the mapping is performed using a plurality of passes. A different assumption is made with respect to a property of the FPGA during each pass of mapping. The property may be, for example, the inputs supported by adaptive LUTs on the FPGA. In this example, during a first pass, components of a logic design are mapped onto adaptive LUTs where the adaptive LUTs are assumed to support a first number of inputs, k1. The mapping results from the first pass that satisfy one or more predetermined conditions are preserved. During a second pass, components of the logic design having a mapping not satisfying the one or more conditions are mapped onto adaptive LUTs where the adaptive LUTs are assumed to support a second number of inputs, k2.

According to one aspect of this embodiment, the second number of inputs, k2, may be set to be a value less than the first number of inputs, k1.

A netlist may be generated from the mapping performed. The netlist illustrates how the general resources available on the target device are utilized to implement the system. The netlist may, for example, include a representation of the resources on the target device as nodes and how the nodes are connected. The netlist may be an optimized technology-mapped netlist generated from the HDL.

Figure 2:
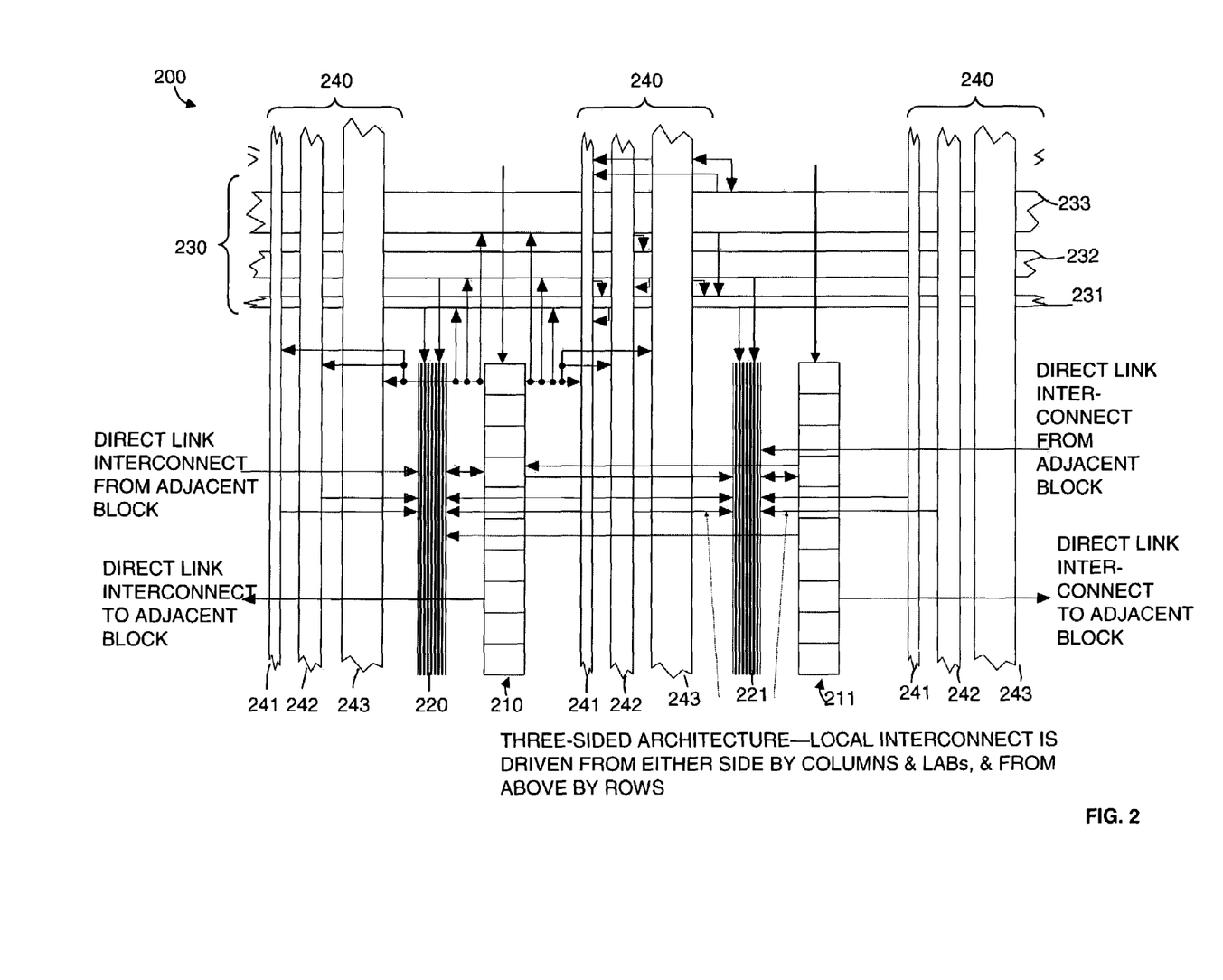
FIG. 2 illustrates a target device utilizing FPGAs according to an embodiment of the present invention.

FIG. 2 illustrates an exemplary target device 200 utilizing FPGAs according to an embodiment of the present invention. The present invention may be used to design a system onto the target device 200. According to one embodiment, the target device 200 is a chip having a hierarchical structure that may take advantage of wiring locality properties of circuits formed therein. The lowest level of the hierarchy is an adaptive logic module (ALM) (not shown). An ALM is a small unit of logic providing efficient implementation of user logic functions. According to one embodiment of the target device 200, an ALM may include a 6-input adaptive LUT with a configurable flip-flop. The ALM is a fracturable logic cell that may configure the adaptive LUT as a single adaptive LUT having a first number of inputs to support a single function. Alternatively, the ALM may configure the adaptive LUT as a plurality of adaptive LUTs having the same or a second number of inputs to support more than one function. It should be appreciated that the ALM may implement an adaptive LUT with other configurations such as one with additional inputs that may be configured to support a larger number of adaptive LUTs.

The target device 200 includes a plurality of logic-array blocks (LABs). Each LAB is formed from a plurality of ALMs, carry chains, LAB control signals, adaptive LUT chains, and register chain connection lines. Adaptive LUT chain connections transfer the output of one ALM's LUT to the adjacent ALM for fast sequential LUT connections within the same LAB. Register chain connection lines transfer the output of one ALM's register to the adjacent ALM's register within a LAB. LABs are grouped into rows and columns across the target device 200. A first column of LABs is shown as 210 and a second column of LABs is shown as 211.

The target device 200 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200.

The target device 200 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 200.

The target device 200 includes a plurality of input/output elements (IOEs) (not shown). Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines 220-221 that transfer signals between LEs in the same LAB. The LAB local interconnect lines are driven by column and row interconnects and LE outputs within the same LAB. Neighboring LABs, memory blocks, or DSP blocks may also drive the LAB local interconnect lines 220-221 through direct link connections.

The target device 200 also includes a plurality of row interconnect lines ("H-type wires") 230 that span fixed distances. Dedicated row interconnect lines 230, that include H4 231, H8 232, and H24 233 interconnects, route signals to and from LABs, DSP blocks, and memory blocks within the same row. The H4 231, H8 232, and H2 233 interconnects span a distance of up to four, eight, and twenty-four LABs respectively, and are used for fast row connections in a four-LAB, eight-LAB, and twenty-four-LAB region. The row interconnects 230 may drive and be driven by LABs, DSP blocks, RAM blocks, and horizontal IOEs.

The target device 200 also includes a plurality of column interconnect lines ("V-type wires") 240 that operate similarly to the row interconnect lines 230. The column interconnect lines 240 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 240 include V4 241, V8 242, and V16 243 interconnects that traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include components other than those described in reference to the target device 200. Thus, while the invention described herein may be utilized on the architecture described in FIG. 2, it should be appreciated that it may also be utilized on different architectures, such as those employed by Altera® Corporation in its APEX™, Mercury™, Stratix™, and Stratix™ II family of chips and those employed by Xilinx®, Inc. in its Virtex™ and Virtex™ II line of chips.

Figure 3:
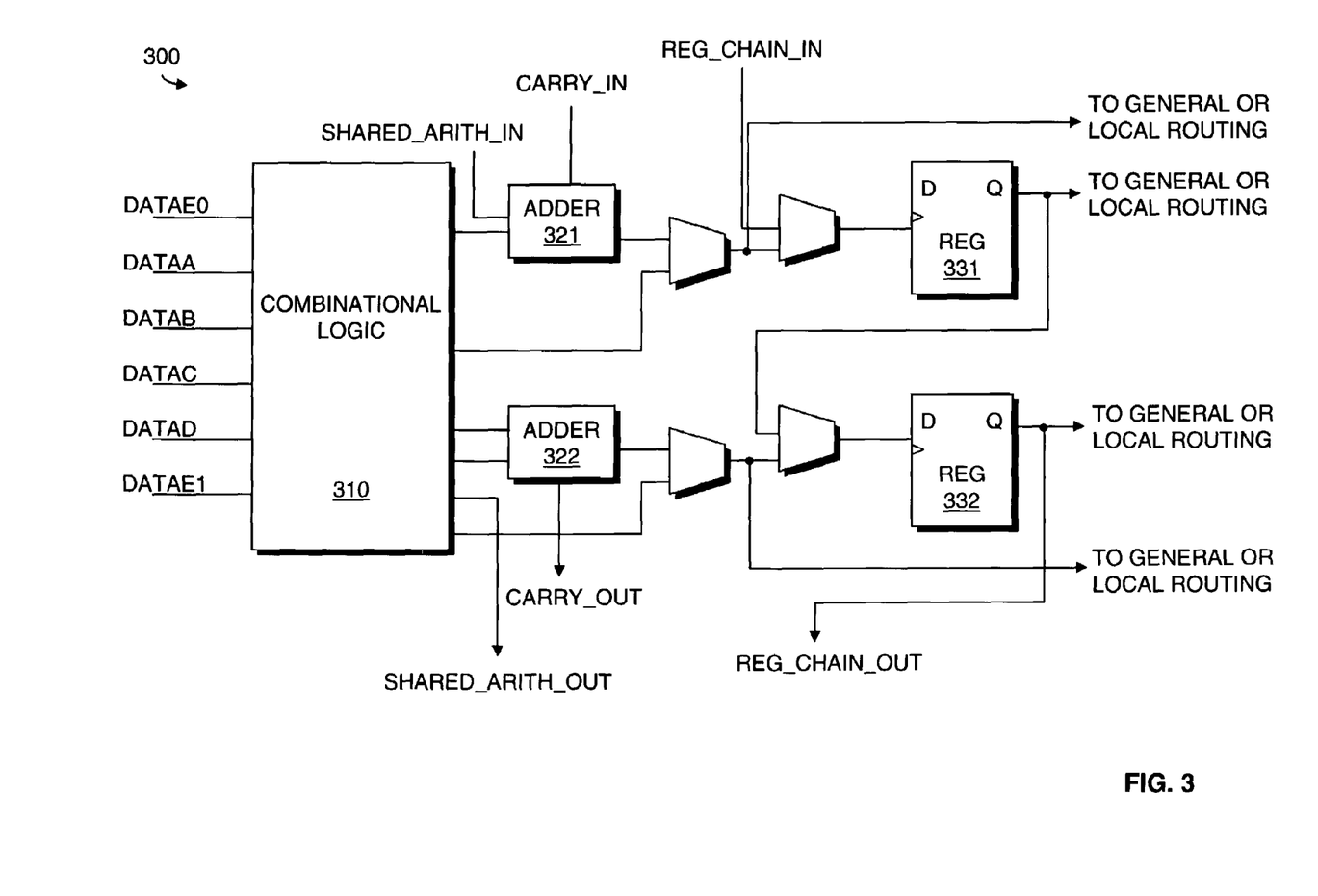
FIG. 3 illustrates an adaptive logic module (ALM) according to an embodiment of the present invention.

FIG. 3 illustrates an ALM 300 according to an embodiment of the present invention. The ALM 300 may be used to implement the ALM described with reference to FIG. 2. The ALM 300 includes combinational logic 310 having a plurality of LUTs and LUT-based resources that can be divided between two adaptive LUTs. With up to six inputs to the two adaptive LUTs, the ALM 300 can implement various combinations of two functions. The ALM 300 also includes dedicated full adders 321 and 322, programmable registers 331 and 332, a carry chain, a shared arithmetic chain, and a register chain. The ALM 300 may implement various arithmetic functions and shift registers using these resources. It should be appreciated that the ALM 300 may be implemented using a different architecture that may support other features such as the mapping of multiplexers having various numbers of data inputs.

Referring back to FIG. 1 at 103, the mapped logical system design is placed. Placement works on the optimized technology-mapped netlist to produce a placement for each of the logic components. According to an embodiment of the present invention, placement includes fitting the system on the target device by determining the specific resources on the target device to be used for implementing the general resources mapped for logic components at 102. The placement procedure may be performed by a placer in an EDA tool that utilizes placement algorithms.

At 104, routing of the system is performed. During routing, routing resources on the target device are allocated to provide interconnections between logic gates, logic elements, and other components on the target device. The routing procedure may be performed by a router in an EDA tool that utilizes routing algorithms.

Figure 4:
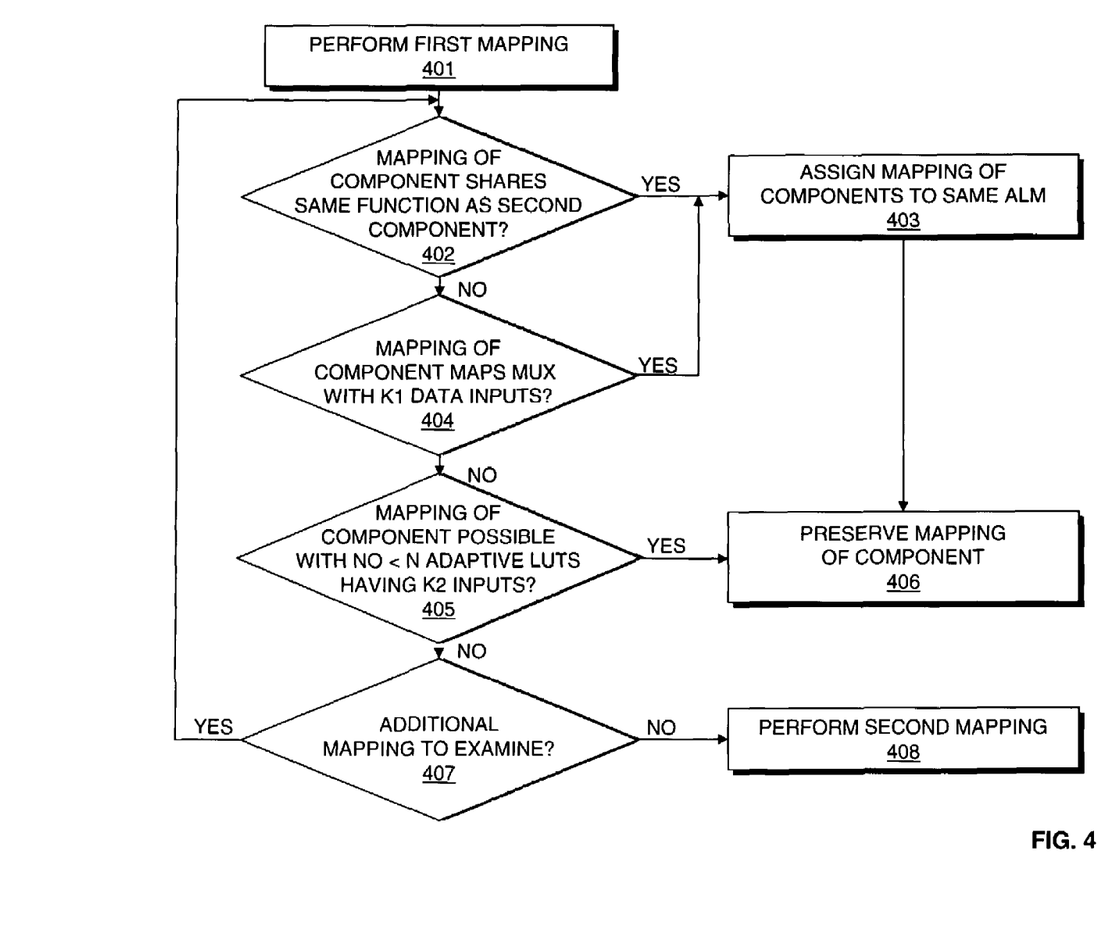
FIG. 4 is a flow chart illustrating a method for performing multiple pass mapping according to an embodiment of the present invention.

FIG. 4 is a flow chart illustrating a method for performing multiple pass mapping according to an embodiment of the present invention. The method illustrated in FIG. 4 may be used at 102 shown in FIG. 2 to map logic components. At 401, a first mapping of components of a system onto adaptive LUT of a FPGA is performed. The adaptive LUTs are assumed to support a first number of inputs, k1, during the first mapping. Each of the mappings from the first mapping is examined to determined whether it satisfies one of the conditions as described as follows.

At 402, it is determined whether a mapping of a component utilizes the first number of inputs, k1, to an adaptive LUT and shares a same function with a second component having a mapping that utilizes the first number, k1, of inputs to an adaptive LUT. According to an embodiment of the present invention, this condition may be evaluated by comparing a LUT mask of the component with a LUT mask of the second component. If the LUT masks match, it may be determined that the condition is satisfied. If the mapping satisfies this condition, control proceeds to 403. If the mapping does not satisfy this condition, control proceeds to 404.

At 403, the mapping of the component(s) are assigned a same adaptive logic module. Control proceeds to 406.

At 404, it is determined whether a mapping of a component utilizes the first number of inputs, k1, to a first adaptive LUT and the first number of inputs, k1, to a second adaptive LUT to form a multiplexer of k1 data inputs. According to an embodiment of the present invention, this condition may be evaluated by comparing a LUT mask of the first and second adaptive LUTs with a LUT mask of multiplexer. If the LUT masks match, it may be determined that the condition is satisfied. If the mapping satisfies this condition, the mapping of the components are assigned to a same adaptive logic module and control proceeds to 403. If the mapping does not satisfy this condition, control proceeds to 405.

At 405, it is determined whether the mapping of the component utilizes the first number of inputs, k1, to an adaptive LUT and can be implemented with no fewer than N adaptive LUTs having the second number of inputs, k2. According to an embodiment of the present invention, the value N can be set to a high value such that when an adaptive LUT can be implemented with no fewer than N adaptive LUTs having k2 inputs, the condition indicates that the mapping to the adaptive LUT utilizing the k1 inputs is an efficient one where the function implemented by the component is complex. If the mapping satisfies this condition, control proceeds to 406. If the mapping does not satisfy this condition, control proceeds to 407.

At 406, the mapping of the component(s) is preserved.

At 407, it is determined whether an additional mapping needs to be examined. If it is determined that an additional mapping needs to be examined, control proceeds to 402 to examine the mapping. If it is determined that an additional mapping needs not be examined, control proceeds to 408.

At 408, a second mapping is performed on components of the system having a first mapping not satisfying one of the conditions. The mapping is made onto adaptive LUTs of the FPGA where the adaptive LUTs are assumed to support a second number of inputs, k2.

The preserved mapping from 406 and the second mapping from 408 are utilized as the mapping for the logic design. The multiple pass mapping technique described allows a designer to generate a mapping that has a reduced number of unpacked fracturable logic cells and that takes advantage of the features of the fracturable logic cells such as shared LUT masks. This results in an FPGA design with improved density.

According to an embodiment of the present invention, the first number, k1, has a value greater than the second number, k2. In one embodiment, where the adaptive logic module includes an adaptive LUT that supports 6 inputs, k1 may be set to 4 and k2 may be set to 3. It should be appreciated that the values for k1 and k2 may be modified to support adaptive logic modules that includes a different adaptive LUT structure. It should also be appreciated that results from the second mapping may be evaluated and that additional mapping(s) may be performed in embodiments where adaptive LUTs may support a third number of inputs, k3.

FIG. 4 is a flow chart illustrating a method for performing mapping according to an exemplary embodiment of the present invention. Some of the techniques illustrated in this figure may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention (e.g. exemplary process described with respect to FIG. 4) may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks, ROMs, RAMs, EPROMs, EEPROMs, magnetic or optical cards, flash memory, or other type of media/machine-readable medium suitable for storing electronic instructions.

Figure 5:
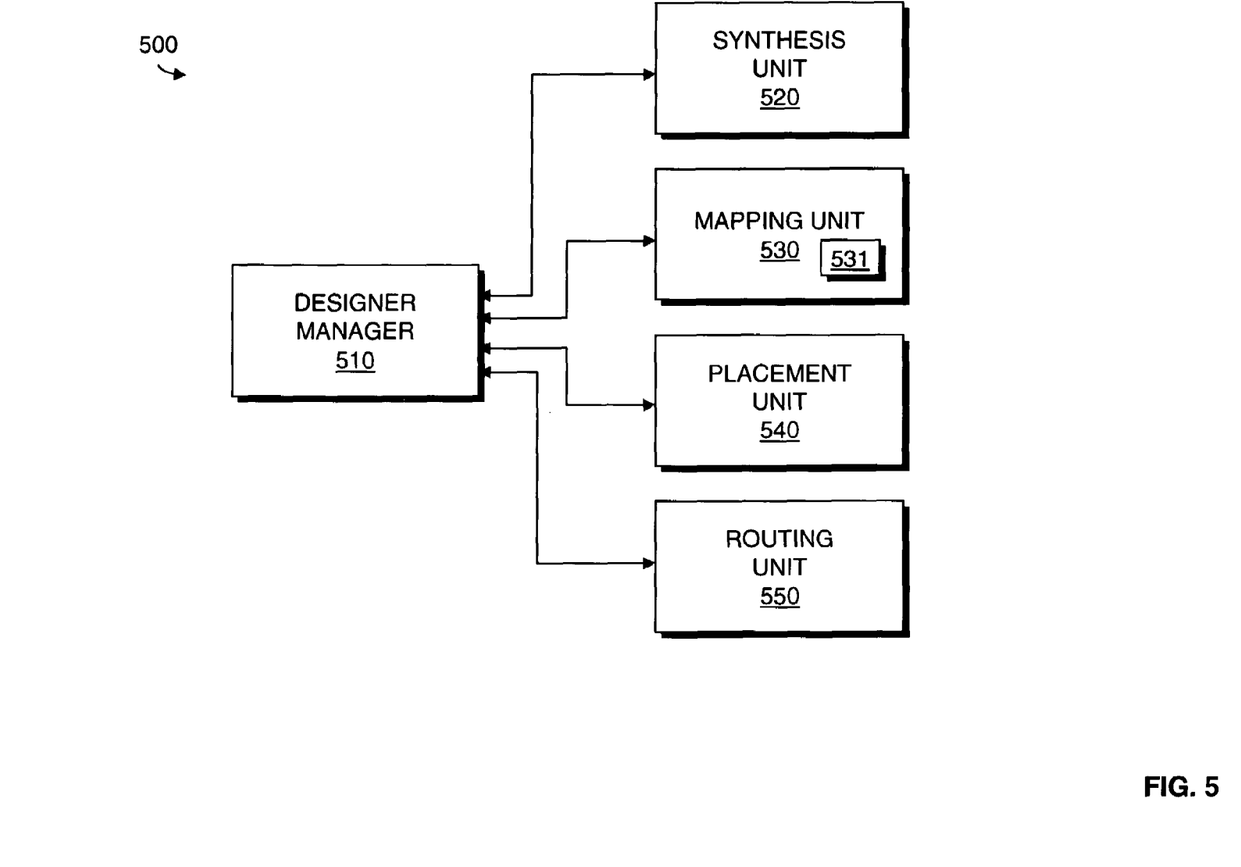
FIG. 5 is a block diagram illustrating a system designer according to an embodiment of the present invention.

FIG. 5 is a block diagram illustrating a system designer 500 according to an embodiment of the present invention. The system designer 500 may be an EDA tool. FIG. 5 illustrates software modules implementing an embodiment of the present invention. According to one embodiment, system design may be performed by a computer system (not shown) executing sequences of instructions represented by the software modules shown in FIG. 5. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 500 includes a designer manager 510. The designer manager 510 interfaces with and manages the other components in the system designer 500.

The system designer 500 includes a synthesis unit 520. The synthesis unit 520 generates a logic design of a system to be implemented by the target device such as the target device 200 shown in FIG. 2. According to an embodiment of the system designer 500, the synthesis unit 520 takes a conceptual HDL design definition and generates an optimized logical representation of the system. The optimized logical representation of the system generated by the synthesis unit 520 may include a representation that has a minimized number of components such as functional blocks and registers required for the system. Alternatively, the optimized logical representation of the system generated by the synthesis unit 520 may include a representation that has a reduced depth of logic and that generates a lower signal propagation delay.

The system designer 500 includes a mapping unit 530. The mapping unit 530 determines how to implement functional blocks and registers in the optimized logic representation utilizing specific resources on the target device. The mapping unit 530 includes a multi-pass mapping unit 531 that may be utilized to map logic components onto fracturable logic cells on the target device. The multi-pass mapping unit 531 maps the logic components using a plurality of passes. A different assumption is made with respect to a property of the target device during each pass of mapping. The property may be, for example, the inputs supported by adaptive LUTs on the target device. In this example, during a first pass, components of a logic design are mapped onto adaptive look up table LUTs where the adaptive LUTs are assumed to support a first number of inputs, k1. The mapping results from the first pass that satisfies one or more condition predetermined conditions are preserved. During a second pass, components of the logic design having a mapping not satisfying the one or more conditions are mapped onto adaptive LUTs where the adaptive LUTs are assumed to support a second number of inputs, k2. According to one aspect of this embodiment, the second number of inputs, k2, may be set to be a value less than the first number of inputs, k1.

The mapping unit 530 creates an optimized "technology-mapped" netlist. The technology-mapped netlist illustrates how the resources on the target device are utilized to implement the system. The technology-mapped netlist may, for example, contain components such as ALMs on the target device.

The system designer 500 includes a placement unit 540. The placement unit 540 fits the system on the target device by determining which resources on the target device are to be used for specific functional blocks and registers. According to an embodiment of the system designer 500, the placement unit 540 first determines how to implement portions of the optimized logic design in clusters. Clusters may represent a subset of the components on a target device such as, for example, a LAB having 8 ALMs. In this embodiment, after portions of the optimized logic design are implemented in clusters, the clusters may be placed by assigning the clusters to specific LABs on the target device. Following the placement of the clusters, routing interconnections between the ALMs may be performed. The placement unit 540 may utilize a cost function in order to determine a good assignment of resources on the target device.

The system designer 500 includes a routing unit 550. The routing unit 550 determines the routing resources on the target device to use to provide interconnection between the functional blocks and registers on the target device.

Figure 6:
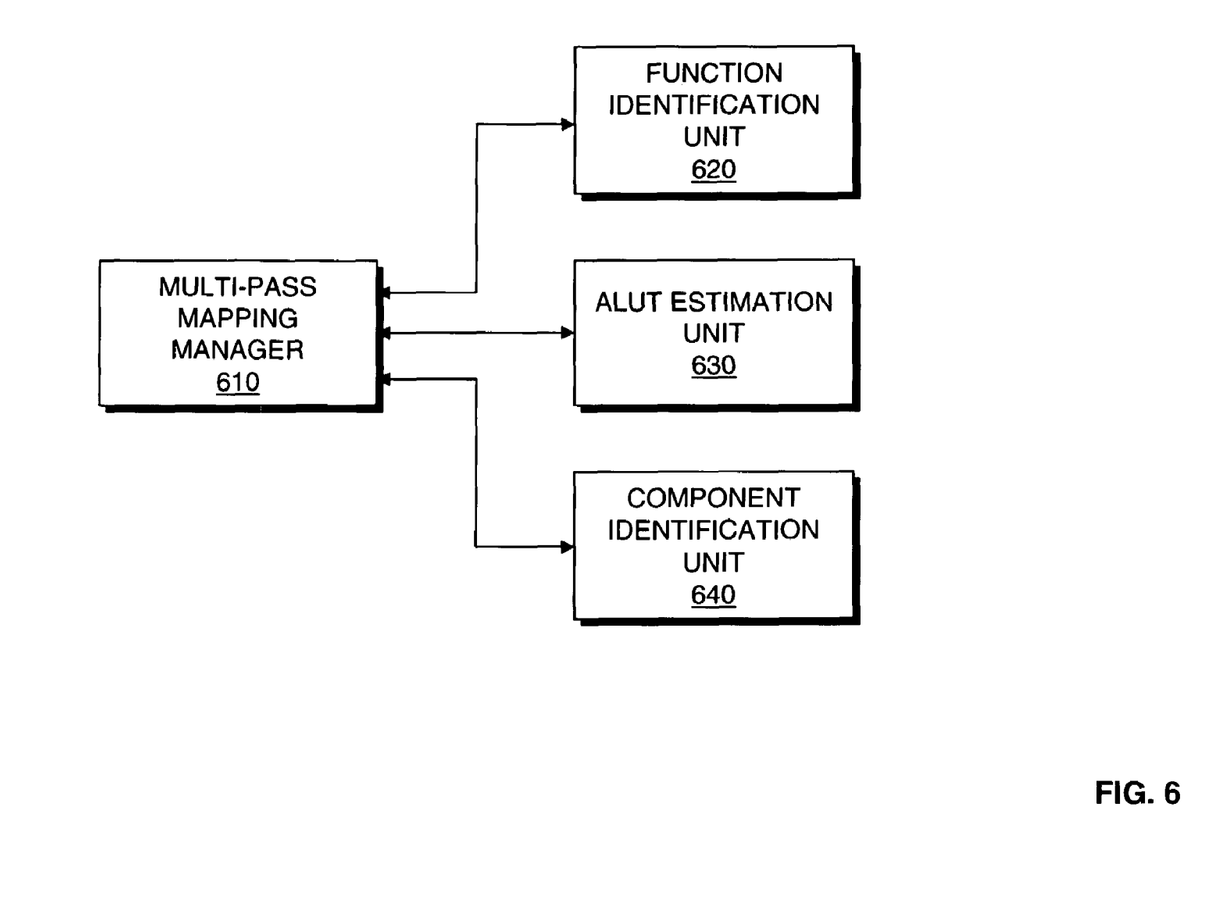
FIG. 6 is a block diagram illustrating a multi-pass mapping unit according to an embodiment of the present invention.

FIG. 6 is a block diagram illustrating a multi-pass mapping unit 600 according to an embodiment of the present invention. The multi-pass mapping unit 600 may be implemented as the multi-pass mapping unit 531 shown in FIG. 5. The multi-pass mapping unit 600 includes a multi-pass mapping manager 610. The multi-pass mapping manager 610 maps components in a logic design onto adaptive LUTs on a FPGA. The multi-pass mapping manager 610 may perform mapping using a plurality of passes where a different assumption is made with respect to a property of the FPGA during each pass. According to an embodiment of the present invention, the property is related to a structure of adaptive look up tables LUTs on the FPGA. In this embodiment, the multi-pass mapping manager 610 may be configured to map the components onto adaptive LUTs assumed to support a first number of inputs, k1, during a first pass of mapping. The multi-pass manager 610 transmits the mapping of components from the first pass to the other components in the multi-pass mapping unit 600 to determine whether a mapping of a component satisfies one or more conditions. The mapping of components that satisfy one or more conditions are preserved. The components associated with mappings that do not satisfy one or more conditions are mapped onto adaptive LUTs assumed to support a second number of inputs, k2, during a second pass of mapping.

The multi-pass mapping unit 600 includes a function identification unit 620. The function identification unit 620 receives the mapping of components from the multi-pass manager 610. For each mapping of a component onto an adaptive LUT that utilizes k1 inputs, the function identification unit 620 attempts to identify a mapping of a second component onto an adaptive LUT that also utilizes k1 inputs and that performs a same function as the first component. According to an embodiment of the multi-pass mapping unit 600, the function identification unit 620 identifies components having a similar LUT mask. Components having mappings onto adaptive LUTs that utilize k1 inputs and that perform the same function are designated as partners. The mapping of these components are preserved and are assigned to be mapped onto a same ALM by the multi-pass mapping manager 610.

The multi-pass mapping unit 600 includes an adaptive LUT (ALUT) estimation unit 630. The ALUT estimation unit 630 receives the mapping of components from the multi-pass mapping manager 610. For each mapping of a component onto an adaptive LUT that utilizes k1 inputs, the ALUT estimation unit 630 determines whether the component can be mapped onto no fewer than N adaptive LUTs that support k2 inputs. If the component cannot be mapped onto no fewer than N adaptive LUTs that support k2 inputs, the ALUT estimation unit 630 identifies that the mapping generated by the multi-pass manager 610 as an efficient mapping. The mapping of the component is preserved by the multi-pass mapping manager 610.

The multi-pass mapping unit 600 includes a component identification unit 640. The multi-pass mapping unit 640 receives the mapping of components from the multi-pass mapping manager 610. For each mapping of a component, the component identification unit 640 determines whether the mapping utilizes the first number of inputs, k1, to a first adaptive LUT and the first number of inputs, k1, to a second adaptive LUT to form a multiplexer of k1 data inputs. According to an embodiment of the multi-pass unit 600, this condition may be evaluated by comparing a LUT mask of the first and second adaptive LUTs with a LUT mask of multiplexer. If the LUT masks match, it may be determined that the condition is satisfied. If the mapping satisfies this condition, the mapping of the components are assigned to a same adaptive logic module and are preserved by the multi-pass mapping manager 610.

Components having a mapping not preserved by the multi-pass mapping manager 610 are mapped during a second pass of mapping. The second pass of mapping maps the components onto adaptive LUTs assumed to support a second number of inputs, k2. The results of the second pass of mapping is used with the preserved mapping from the first pass of mapping to map the components.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for designing a system on a field programmable gate array (FPGA), comprising:
    performing a first mapping of components of the system onto adaptive look up tables (LUTs) where the adaptive LUTs are assumed to support a first number of inputs;
    determining whether a mapping of a component satisfies one or more conditions;
    performing a second mapping of components of the system onto adaptive LUTs where the adaptive LUTs are assumed to support a second number of inputs when the mapping of the component does not satisfy the one or more conditions; and
    generating a netlist with mapping results.

2. The method of claim 1, wherein determining whether the mapping of the component satisfies one or more conditions comprises determining whether the mapping utilizes the first number of inputs to an adaptive LUT and shares a same function with a second component having a mapping that utilizes the first number of inputs to an adaptive LUT.

3. The method of claim 2, wherein determining whether the mapping of the component satisfies one or more conditions comprises comparing a LUT mask of the component with a LUT mask of the second component.

4. The method of claim 2, further comprising mapping the component and the second component onto a same adaptive logic module.

5. The method of claim 1, wherein determining whether the mapping of the component satisfies one or more conditions comprises determining whether the mapping utilizes the first number of inputs to an adaptive LUT and can be implemented with no fewer than the second number of adaptive LUTs having the second number of inputs.

6. The method of claim 1, wherein determining whether the mapping of the component satisfies one or more conditions comprises determining whether the mapping maps a component that is a multiplexer with the first number of data inputs.

7. The method of claim 1, wherein the first number has a value greater than the second number.

8. The method of claim 1, wherein the first number is 4 and the second number is 3.

9. The method of claim 1, further comprising performing a third mapping of components of the system, having a mapping not satisfying the one or more conditions after the first mapping and one or more conditions after the second mapping, onto adaptive LUTs where the adaptive LUTs are assumed to support a third number of inputs.

10. A machine-readable medium having stored thereon sequences of instructions, the sequences of instructions including instructions which, when executed by a processor, causes the processor to perform:
    performing a first mapping of components of the system onto adaptive look up tables (LUTs) where the adaptive LUTs are assumed to support a first number of inputs;
    determining whether a mapping of a component satisfies one or more conditions;
    performing a second mapping of components of the system onto adaptive LUTs where the adaptive LUTs are assumed to support a second number of inputs when the mapping of the component does not satisfy the one or more conditions; and
    generating a netlist with results from the mapping.

11. The machine-readable medium of claim 10, wherein determining whether the mapping of the component satisfies one or more conditions comprises determining whether the mapping utilizes the first number of inputs to an adaptive LUT and shares a same function with a second component having a mapping that utilizes the first number of inputs to an adaptive LUT.

12. The machine-readable medium of claim 10, wherein determining whether the mapping of the component satisfies one or more conditions comprises determining whether the mapping utilizes the first number of inputs to an adaptive LUT and can be implemented with no fewer than the second number of adaptive LUTs having the second number of inputs.

13. The machine readable medium of claim 10, wherein determining whether the mapping of the component satisfies one or more conditions comprises determining whether the mapping maps a component that is a multiplexer with the first number of data inputs.

14. The machine-readable medium of claim 10, further comprising performing a third mapping of components of the system, having a mapping not satisfying the one or more conditions after the first mapping and one or more conditions after the second mapping, onto adaptive LUTs where the adaptive LUTs are assumed to support a third number of inputs.

15. A multi-pass mapping unit, comprising:
    a multi-pass mapping manager to perform a first mapping of components of the system onto adaptive look up tables (LUTs) where the adaptive LUTs are assumed to support a first number of inputs, to determine whether a mapping of a component satisfies one or more conditions, to perform a second mapping of components of the system onto adaptive LUTs where the adaptive LUTs are assumed to support a second number of inputs when the mapping of the component does not satisfy the one or more conditions, and to generate a netlist with mapping results.

16. The apparatus of claim 15, further comprising a function identification unit that determines whether a mapping of a component utilizes the first number of inputs to an adaptive LUT and shares a same function with a second component having a mapping that utilizes the first number of inputs to an adaptive LUT.

17. The apparatus of claim 15, further comprising an adaptive LUT estimation unit that determines whether a mapping of a component utilizes the first number of inputs to an adaptive LUT and can be implemented with no fewer than the second number of adaptive LUTs having the second number of inputs.

18. The apparatus of claim 15, further comprising a component identification unit that determines whether a mapping of a component maps a component that is a multiplexer with the first number of data inputs.

19. The method of claim 15, wherein the adaptive look up table may be programmed to support more than a single number of inputs.

* * * * *